(12) United States Patent
Lin

(10) Patent No.: US 8,754,790 B2
(45) Date of Patent: Jun. 17, 2014

(54) INPUT DEVICE WITH GHOST KEY SUPPRESSION

(75) Inventor: Shun-Pin Lin, New Taipei (TW)

(73) Assignees: Sunrex Technology Corp., Taichung (TW); Gimbal Technology Co., Ltd., New Taipei (TW)

( * ) Notice: Subject to any disclaimer, the term of this patent is extended or adjusted under 35 U.S.C. 154(b) by 769 days.

(21) Appl. No.: 13/043,975

(22) Filed: Mar. 9, 2011

(65) Prior Publication Data

US 2012/0098680 A1 Apr. 26, 2012

(30) Foreign Application Priority Data

Oct. 20, 2010 (TW) ................................ 99220273 U

(51) Int. Cl.
| | | |
|---|---|---|
| *H03K 17/94* | (2006.01) | |
| *H03M 11/00* | (2006.01) | |
| *G06F 3/02* | (2006.01) | |
| *G09G 5/00* | (2006.01) | |

(52) U.S. Cl.
USPC .................. 341/26; 341/20; 341/22; 341/24; 341/25; 345/168

(58) Field of Classification Search
CPC .............. H03M 11/00; H03M 11/003; H01H 2217/012; G06F 3/023
USPC ..................... 341/20, 22, 24, 25, 26; 345/168
See application file for complete search history.

(56) References Cited

U.S. PATENT DOCUMENTS 5,081,453 A * 1/1992 Endoh et al. .................... 341/22
5,220,323 A * 6/1993 Ito et al. .......................... 341/24

* cited by examiner

*Primary Examiner* — Hai Phan
*Assistant Examiner* — Franklin Balseca
(74) *Attorney, Agent, or Firm* — Renner, Otto, Boisselle & Sklar, LLP

(57) ABSTRACT

An input device with ghost key suppression includes a switch module, a comparator, an exchange unit, a bias voltage resistor, and a processing module. The switch module includes a plurality of strobe lines, a plurality of sense lines, and a plurality of switch units. Each of the switch units has a switch and a resistor connected in series between a corresponding one of the strobe lines and a corresponding one of the sense lines. The comparator is configured for comparing a signal received at an input end thereof with a reference signal for generating the comparison signal. The exchange unit is electrically connected to the sense lines and the comparator, and is operable in response to a control input for making and breaking electrical connection between each of the sense lines and the input end of the comparator. The processing module controls operation of the switch module and the exchange unit based on the comparison signal.

5 Claims, 4 Drawing Sheets

INPUT DEVICE WITH GHOST KEY SUPPRESSION

CROSS-REFERENCE TO RELATED APPLICATION

This application claims priority to Taiwanese application no. 099220273 filed on Oct. 20, 2010, which is hereby incorporated by reference.

BACKGROUND OF THE INVENTION

1. Field of the Invention

The invention relates to an input device, more particularly to an input device that is capable of ghost key suppression.

2. Description of the Related Art

FIG. 1 illustrates a conventional keyboard device. A switch module 1 of the keyboard device includes a plurality of strobe lines 111~114, a plurality of sense lines 121~124, and a plurality of switch units 13. Each of the switch units 13 includes a switch 131 electrically connected to a corresponding one of the strobe lines 111~114 and a corresponding one of the sense lines 121~124. When each of the switch 131 connected to the first strobe line 111 and the first sense line 121, the switch 131 connected to the first strobe line 111 and the third sense line 123, and the switch 131 connected to the third strobe line 113 and the first sense line 121 are at a conducting state, a ghost key ON state may result. In this case, in addition to the three switches identified above, the switch 131 electrically connected to the third strobe line 113 and the third sense line 123 may also be erroneously judged as having an ON state even though it is not actually at a conducting state. Further details may be found in U.S. Pat. No. 5,386,584.

In FIG. 2, a second conventional keyboard device capable of eliminating ghost keys is disclosed in U.S. Pat. No. 5,386,584. The second conventional keyboard device differs from the first in that each of the switch units 13' further includes a diode 132 connected to the switch 131 in series. However, this configuration may increase the incurred cost of the keyboard device and prevent the switch module 1 from being printed on a flexible board.

U.S. Pat. No. 4,633,228 discloses a third conventional keyboard device capable of eliminating ghost keys. A switch module 2 of the keyboard device disclosed in the above patent includes a plurality of strobe lines 211~214, a plurality of sense lines 221~224, and a plurality of switch units 23. Each of the switch units 23 includes a switch 231 and a resistor 232 electrically connected in series to a corresponding one of the strobe lines 211~214 and a corresponding one of the sense lines 221~224. Each of the sense lines 221~224 is electrically connected to a power supply source through a corresponding resistor 3. This keyboard device uses the voltage level generated by the resistors 232, 3 connected in series relative to a specific resistor 232 to determine whether a selected one of the switches 231 is at a conducting state. However, this keyboard device has the following disadvantages: (1) for a selected switch 231, when more switches are electrically connected, the equivalent circuit effect of the series-parallel connected resistors 232, 3 often yields incorrect results; (2) the conduction state of only one switch 231 can be determined at a time, which results in an extended time period being required to determine the conducting state of all the switches 231; (3) high precision resistances are required for the resistors 232, 3; and (4) each of the sense lines 221~224 requires one comparator (not shown), and hence the number of comparators increases with the number of the sense lines 221~224.

SUMMARY OF THE INVENTION

Therefore, an object of the present invention is to provide an input device capable of ghost key suppression that overcomes the above drawbacks of the prior art.

According to the present invention, an input device with ghost key suppression includes a switch module, a comparator, an exchange unit, a bias voltage resistor, and a processing module. The switch module includes a plurality of strobe lines, a plurality of sense lines, and a plurality of switch units. Each of the switch units has a switch and a resistor connected in series between a corresponding one of the strobe lines and a corresponding one of the sense lines. The switch of each of the switch units is operable at a selected one of conducting and non-conducting states.

The comparator includes a first input end, a second input end for receiving a reference signal, and an output end for outputting a comparison signal. The comparator is configured for comparing a signal received at the first input end with the reference signal for generating the comparison signal. The exchange unit is electrically connected to the sense lines and the first input end of the comparator. The exchange unit is operable in response to a control input for making and breaking electrical connection between each of the sense lines and the first input end of the comparator. The bias voltage resistor includes a first end and a second end. The first end is electrically connected to the first input end of the comparator, and the second end is configured for receiving a first voltage level.

The processing module is electrically connected to the strobe lines, the comparator and the exchange unit. The processing module is configured for outputting a plurality of strobe signals respectively to the strobe lines, the reference signal to the second input end of the comparator, and the control input to the exchange unit. The processing module is further configured for receiving the comparison signal from the output end of the comparator. The processing module is configured to set at least a part of the strobe signals, the reference signal and the control input such that the comparison signal is able to indicate whether the switch of at least one of the switch units is at a conducting state.

Upon determination by the pressing module that the comparison signal indicates the switch of at least one of the switch units is at a conducting state, the processing module is further configured to set at least a part of the strobe signals, the reference signal and the control input such that the comparison signal is able to indicate whether the switch of at least one of the switch units that are electrically connected to a selected one of the sense lines is at a conducting state.

Upon determination by the processing module that the comparison signal indicates the switch of at least one of the switch units that are electrically connected to the selected one of the sense lines is at a conducting state, the processing module is further configured to set at least a part of the strobe signals, the reference signal and the control input such that the comparison signal is able to indicate whether the switch of the switch unit that is electrically connected to the selected one of the sense lines and a selected one of the strobe lines is at a conducting state.

Some of the advantages of this invention include the following: (1) the switch module does not need to use diodes, which reduces manufacturing costs and permits implementation on a flexible board; (2) the series-parallel connection manner for the resistors is simpler, making judging errors less likely; (3) the processing module can determine whether at least one of all or a selected part of the switches are at a conducting state at the same time, and can omit further determination upon determination of none of all or a selected part of the switches is at a conducting state, which permits faster operation; (4) the invention permits wider variation in the resistance precision of the resistors; and (5) only one comparator is required.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
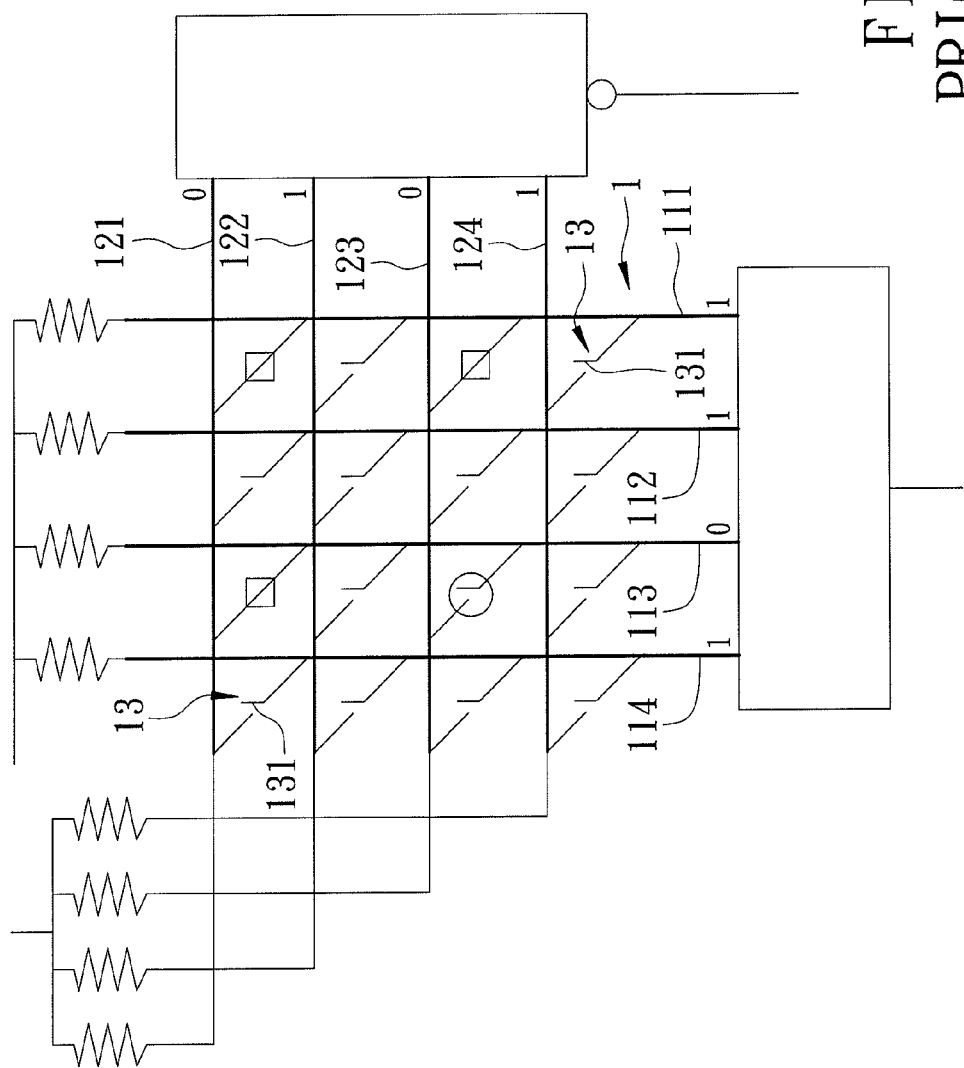
FIG. 1 is a schematic circuit diagram for illustrating a conventional keyboard device.
Figure 2:
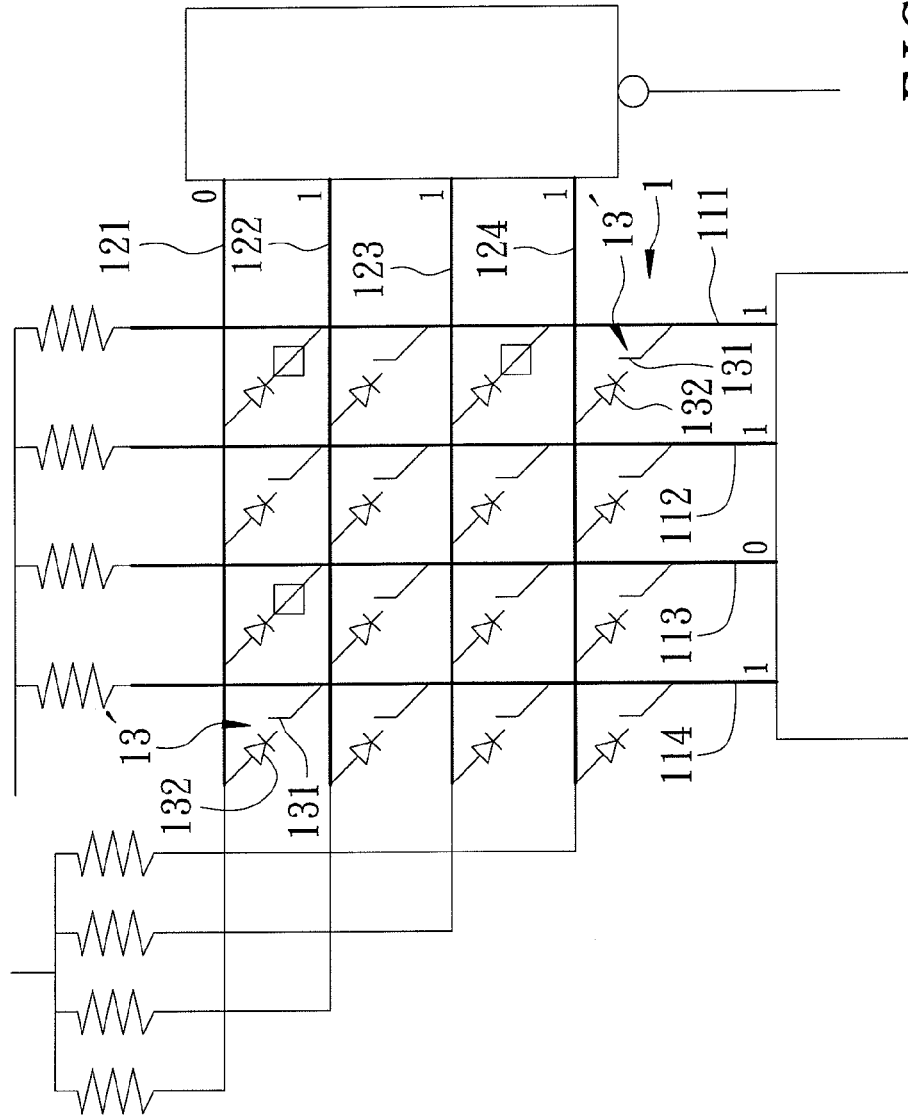
FIG. 2 is a schematic circuit diagram for illustrating another conventional keyboard device.
Figure 3:
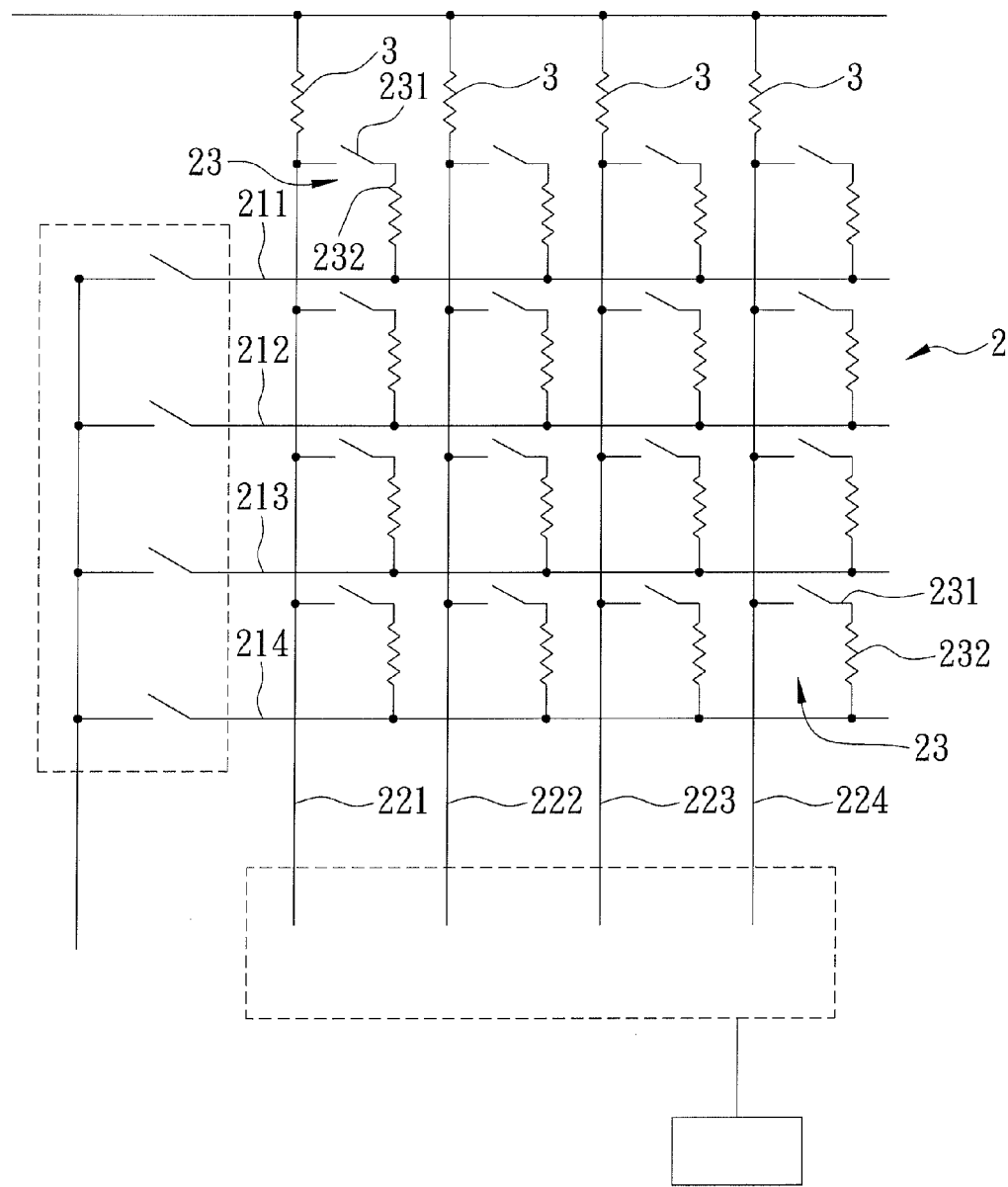
FIG. 3 is a schematic circuit diagram for illustrating yet another conventional keyboard device.
Figure 4:
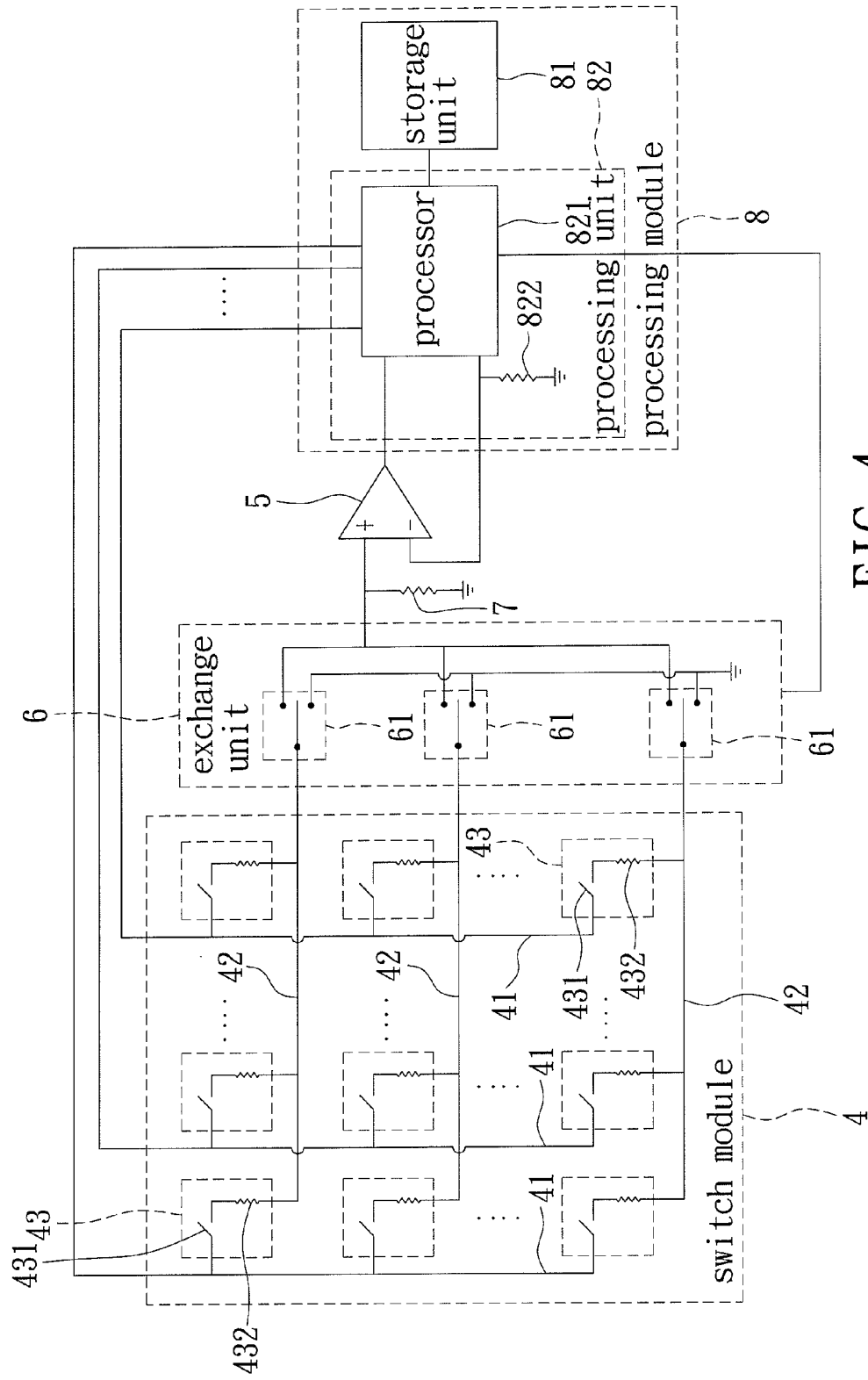
FIG. 4 is a schematic circuit diagram for illustrating the preferred embodiment of an input device according to the present invention.

Referring to FIG. 4, the preferred embodiment of an input device with ghost key suppression according to the present invention is shown to include a switch module 4, a comparator 5, an exchange unit 6, a bias voltage resistor 7 and a processing module 8.

The switch module 4 includes a plurality of strobe lines 41, a plurality of sense lines 42, and a plurality of switch units 43. Each of the switch units 43 has a switch 431 and a resistor 432 connected in series between a corresponding one of the strobe lines 41 and a corresponding one of the sense lines 42. The switch 431 of each switch unit 43 is operable at a selected one of conducting and non-conducting states.

The comparator 5 includes a first input end, a second input end for receiving a reference signal, and an output end for outputting a comparison signal. The comparator 5 is configured for comparing a signal received at the first input end with the reference signal for generating the comparison signal. In this embodiment, the first input end is a non-inverting input end, and the second input end is an inverting input end.

The exchange unit 6 is electrically connected to the sense lines 42 and the first input end of the comparator 5, and is operable in response to a control input for making and breaking electrical connection between each of the sense lines 42 and the first input end of the comparator 5. In this embodiment, the exchange unit 6 includes a plurality of single-pole, double-throw (SPDT) switches 61, each of which includes a first end electrically connected to a corresponding one of the sense lines 42, a second end electrically connected to the first input end of the comparator 5, and a third end for receiving a first voltage level (such as a grounding voltage level). Each SPDT switch 61 makes an electrical connection either between the respective first and second ends or between the respective first and third ends according to the control input.

The bias voltage resistor 7 includes a first end and a second end. The first end is electrically connected to the first input end of the comparator 5, and the second end is configured for receiving the first voltage level such that the voltage level of the first input end of the comparator 5 is biased weakly to the first voltage level. Accordingly, if the exchange unit 6 outputs a voltage level to the first input end of the comparator 5, the voltage level of the first input end of the comparator 5 equals the voltage level output by the exchange unit 6; otherwise the voltage level of the first input end of the comparator 5 is substantially equal to the first voltage level.

The processing module 8 includes a storage unit 81 and a processing unit 82. The storage unit 81 stores the switch states of the switches 431 of the switch units 43. The processing unit 82 is electrically connected to the strobe lines 41, the comparator 5, the exchange unit 6 and the storage unit 81. The processing unit 82 of the processing module 8 is configured for outputting a plurality of strobe signals respectively to the strobe lines 41, the reference signal to the second input end of the comparator 5, and the control input to the exchange unit 6. The processor 821 receives the comparison signal from the output end of the comparator 5.

The processing unit 82 sets the switch states of the switches 431 stored in the storage unit 81 at an OFF state. For the comparison signal to indicate whether at least one switch 431 of the switch units 43 is at a conducting state, the processing unit 82 sets each of the strobe signals to a second voltage level (such as a power source voltage level) higher than the first voltage level, sets the reference signal at a third voltage level between the first voltage level and the second voltage level, and sets the control input such that the exchange unit 6 electrically connects all of the sense lines 42 to the first input end of the comparator 5. When the voltage level of the first input end of the comparator 5 is higher than the third voltage level, the comparison signal is pulled to the second voltage level to indicate at least one switch 431 of the switch units 43 is at a conducting state. Otherwise, the comparison signal is pulled to the first voltage level to indicate that no switch 431 of the switch units 43 is at a conducting state.

In this embodiment, the third voltage level is substantially equal to 0.9 times the second voltage level. When no switch 431 of the switch units 43 is at a conducting state, the voltage level of the first input end of the comparator 5 is biased to the first voltage level by the bias voltage resistor 7. When at least one switch 431 of the switch units 43 is at a conducting state, the voltage level of the first input end of the comparator 5 is biased to the second voltage level by the switch module 4. As such, as long as the third voltage level is between the first voltage level and the second voltage level, determination can be performed. However, to prevent noise signal interference from causing judging errors, the difference between the third voltage level and the second voltage level is preferably equal to or greater than a predetermined threshold.

Furthermore, when it is determined by the processing unit 82 that the comparison signal indicates at least one switch 431 of the switch units 43 is at a conducting state, for the comparison signal to indicate whether the switch 431 of at least one of the switch units 43 that are electrically connected to a selected one of the sense lines 42 is at a conducting state, the processing unit 82 of the processing module 8 sets the reference signal to a fourth voltage level between the first voltage level and the second voltage level, and sets the control input to drive the exchange unit 6 to electrically connect the selected one of the sense lines 42 to the first input end of the comparator 5 and to cause the non-selected sense lines 42 to receive the first voltage level. When the voltage level of the first input end of the comparator 5 is higher than the fourth voltage level, the comparison signal is pulled to the second voltage level to indicate at least one switch 431 of the switch units 43 electrically connected to the selected one of the sense lines 42 is at a conducting state. Otherwise, the comparison signal is pulled to the first voltage level to indicate no switch 431 of the switch units 43 electrically connected to the selected one of the sense lines 42 is at a conducting state.

In this embodiment, the fourth voltage level equals the second voltage level times 1/(2+2n), where (n) is the number of the strobe lines 41. When no switch 431 of the switch units 43 electrically connected to the selected one of the sense lines 42 is at a conducting state, the voltage level of the first input end of the comparator 5 is biased to the first voltage level by the bias voltage resistor 7. When at least one switch 431 of the switch units 43 electrically connected to the selected one of the sense lines 42 is at a conducting state, the voltage level of the first input end of the comparator 5 is biased to the second voltage level by the switch module 4.

Furthermore, when it is determined by the processing unit 82 that the comparison signal indicates at least one switch 431 of the switch units 43 electrically connected to the selected one of the sense lines 42 is at a conducting state, for the comparison signal to indicate whether the switch 431 of the switch unit 43 electrically connected to the selected one of the sense lines 42 and a selected one of the strobe lines 41 is at a conducting state, the processing unit 82 sets the strobe signal to the selected one of the strobe lines 41 to the second voltage level, and sets the rest of the strobe signals to the first voltage level or in a state of high impedance. When the voltage level of the first input end of the comparator 5 is higher than the fourth voltage level, the comparison signal is pulled to the second voltage level to indicate the switch 431 of the switch units 43 electrically connected to the selected one of the sense lines 42 and the selected one of the strobe lines 41 is at a conducting state. Otherwise, the comparison signal is pulled to the first voltage level to indicate the switch 431 of the switch unit 43 electrically connected to the selected one of the sense lines 42 and the selected one of the strobe lines 41 is at a conducting state.

When the switch 431 of the switch unit 43 electrically connected to the selected one of the sense lines 42 and the selected one of the strobe lines 41 is at a non-conducting state, the voltage level of the first input end of the comparator 5 is biased to the first voltage level by the bias voltage resistor 7. When the switch 431 of the switch unit 43 electrically connected to the selected one of the sense lines 42 and the selected one of the strobe lines 41 is at a conducting state, the voltage level of the first input end of the comparator 5 is higher than or equal to the second voltage level times 1/n. As such, as long as the fourth voltage level is between the first voltage level and 1/n of the second voltage level, determination can be performed. However, to prevent noise signal interference from causing judging errors, the difference between the fourth voltage level and 1/n of the second voltage level is preferably equal to or higher than a predetermined threshold.

When it is determined by the processing unit 82 that the comparison signal indicates the switch 431 of the switch unit 43 electrically connected to the selected one of the sense lines 42 and the selected one of the strobe lines 41 is at a conducting state, the processing unit 82 sets the switch state of the switch 431 of the switch unit 43 stored in the storage unit 81 to an ON state.

In this embodiment, the processing unit 82 includes a processor 821 and a converting resistor 822. The processor 821 is for outputting the strobe signals, a reference current, and the control input, and for receiving the comparison signal. The converting resistor 822 is electrically connected to the processor 821 for converting the reference current to the reference signal. The processor 821 sets all the switch states of the switches 431 of the switch units 43 stored in the storage unit 81 to an OFF state, and sets the strobe signals, the reference signal, and the control input. Upon determination by the processor 821 that the comparison signal indicates that the switch 431 of the switch unit 43 electrically connected to the selected one of the sense lines 42 and the selected one of the strobe lines 41 is at a conducting state, the processor 821 sets the switch state of the switch 431 of the switch unit 43 stored in the storage unit 81 to an ON state.

The input device of this embodiment can be a keyboard, a resistive touch control device, etc., but these embodiments should not be imposed as an implementation limitation. The comparator 5, the exchange unit 6, the bias voltage resistor 7 and the processing module 8 can be integrated into an integrated circuit, but may be implemented using a plurality of separate circuits.

In summary, this invention of an input device capable of ghost key suppression has the following advantages: (1) the switch module 4 does not need to use diodes, which reduces manufacturing costs and permits implementation on a flexible board; (2) the series-parallel connection manner for the resistors 432 is simpler, making judging errors less likely; (3) the processing module can determine whether at least one of all or a selected part of the switches are at a conducting state at the same time, and can omit further determination upon determination of none of all or a selected part of the switches is at a conducting state, which permits faster operation; (4) the invention permits wider variation in the resistance precision of the resistors 432; and (5) only one comparator 5 is required.

While the present invention has been described in connection with what is considered the most practical and preferred embodiment, it is understood that this invention is not limited to the disclosed embodiment but is intended to cover various arrangements included within the spirit and scope of the broadest interpretation to encompass all such modifications and equivalent arrangements.

What is claimed is:

1. An input device comprising:
a switch module including a plurality of strobe lines, a plurality of sense lines, and a plurality of switch units, each of said switch units having a switch and a resistor connected in series between a corresponding one of said strobe lines and a corresponding one of said sense lines, said switch of each of said switch units being operable at a selected one of conducting and non-conducting states;
a comparator including a first input end, a second input end for receiving a reference signal, and an output end for outputting a comparison signal, said comparator being configured for comparing a signal received at said first input end with the reference signal for generating the comparison signal;
an exchange unit electrically connected to said sense lines and said first input end of said comparator, and operable in response to a control input for making and breaking electrical connection between each of said sense lines and said first input end of said comparator;
a bias voltage resistor including a first end and a second end, said first end being electrically connected to said first input end of said comparator, said second end being configured for receiving a first voltage level; and
a processing module that is electrically connected to said strobe lines, said comparator and said exchange unit, wherein said processing module is configured for outputting a plurality of strobe signals respectively to said strobe lines, the reference signal to said second input end of said comparator, and the control input to said exchange unit, said processing module being further configured for receiving the comparison signal from said output end of said comparator;

wherein said processing module is configured to set at least a part of the strobe signals, the reference signal and the control input such that the comparison signal is able to indicate whether said switch of at least one of said switch units is at a conducting state;

wherein, upon determination by said processing module that the comparison signal indicates said switch of at least one of said switch units is at a conducting state, said processing module is further configured to set at least a part of the strobe signals, the reference signal and the control input such that the comparison signal is able to indicate whether said switch of at least one of said switch units that are electrically connected to a selected one of said sense lines is at a conducting state;

wherein, upon determination by said processing module that the comparison signal indicates said switch of at least one of said switch units that are electrically connected to the selected one of said sense lines is at a conducting state, said processing module is further configured to set at least a part of the strobe signals, the reference signal and the control input such that the comparison signal is able to indicate whether said switch of said switch unit that is electrically connected to the selected one of said sense lines and a selected one of said strobe lines is at a conducting state.

2. The input device of claim 1, wherein, for the comparison signal to indicate whether said switch of at least one of said switch units is at a conducting state, said processing module sets the strobe signals to a second voltage level higher than the first voltage level, sets the reference signal to a third voltage level between the first voltage level and the second voltage level, and sets the control input such that said exchange unit electrically connects all of said sense lines to said first input end of said comparator;

wherein, upon determination by said processing module that the comparison signal indicates said switch of at least one of said switch units is at a conducting state, for the comparison signal to indicate whether said switch of at least one of said switch units that are electrically connected to a selected one of said sense lines is at a conducting state, said processing module sets the reference signal to a fourth voltage level between the first voltage level and the second voltage level, and sets the control input such that said exchange unit electrically connects the selected one of said sense lines to said first input end of said comparator, and such that said exchange unit causes non-selected ones of said sense lines to receive the first voltage level; and wherein, upon determination by said processing module that the comparison signal indicates said switch of at least one of said switch units that are electrically connected to the selected one of said sense lines is at a conducting state, for the comparison signal to indicate whether said switch of said switch unit that is electrically connected to the selected one of said sense lines and a selected one of said strobe lines is at a conducting state, said processing module sets the strobe signal to the selected one of said strobe lines to the second voltage level, and sets the strobe signals to non-selected ones of said strobe lines to one of the first voltage level and a high-impedance state.

3. The input device of claim 1, wherein said processing module includes:
   a storage unit for storing switch states of said switches of said switch units; and
   a processing unit electrically connected to said storage unit, said processing unit outputting the strobe signals, the reference signal and the control input, and receiving the comparison signal;
   wherein said processing unit sets all of the switch states stored in said storage unit to an OFF state, sets the strobe signals, the reference signal and the control input, and upon determination by said processing unit that the comparison signal indicates said switch of said switch unit that is electrically connected to the selected one of said sense lines and the selected one of said strobe lines is at a conducting state, sets the switch state of said switch of said switch unit stored in said storage unit to an ON state.

4. The input device of claim 3, wherein said processing unit includes:
   a processor for outputting the strobe signals, a reference current, and the control input, and for receiving the comparison signal; and
   a converting resistor electrically connected to said processor for converting the reference current to the reference signal;
   wherein said processor sets all of the switch states stored in said storage unit to an OFF state, sets the strobe signals, the reference current and the control input, and upon determination by said processor that the comparison signal indicates said switch of said switch unit that is electrically connected to the selected one of said sense lines and the selected one of said strobe lines is at a conducting state, sets the switch state of said switch of said switch unit stored in said storage unit to an ON state.

5. The input device of claim 1, wherein said exchange unit includes a plurality of single-pole, double-throw (SPDT) switches that operate at a selected one of first and second states based on the control input,
   each of said SPDT switches including a first end electrically connected to a corresponding one of said sense lines, a second end electrically connected to said first input end of said comparator, and a third end configured for receiving the first voltage level,
   wherein, in the first state, said SPDT switch electrically connects said first and second ends thereof, and in the second state, said SPDT switch electrically connects said first and third ends thereof.

* * * * *